(12) United States Patent
Shimura et al.

(10) Patent No.: US 8,077,882 B2
(45) Date of Patent: Dec. 13, 2011

(54) AUDIO REPRODUCING APPARATUS

(75) Inventors: Masaru Shimura, Kanagawa (JP); Taro Nakagami, Kanagawa (JP); Kazunobu Ohkuri, Kanagawa (JP)

(73) Assignee: Sony Corporation, Tokyo (JP)

( * ) Notice: Subject to any disclaimer, the term of this patent is extended or adjusted under 35 U.S.C. 154(b) by 1100 days.

(21) Appl. No.: 11/904,451

(22) Filed: Sep. 27, 2007

(65) Prior Publication Data

US 2008/0292114 A1 Nov. 27, 2008

(30) Foreign Application Priority Data

Oct. 18, 2006 (JP) ................................. 2006-283532

(51) Int. Cl.
*H03G 5/00* (2006.01)

(52) U.S. Cl. ........................... 381/102; 381/103; 381/61

(58) Field of Classification Search .......... 381/102–103, 381/61

See application file for complete search history.

(56) References Cited

U.S. PATENT DOCUMENTS

| | | | | |
|---|---|---|---|---|
| 5,930,373 A * | 7/1999 | Shashoua et al. | ............... | 381/98 |
| 6,111,960 A | 8/2000 | Aarts et al. | | |
| 6,134,330 A | 10/2000 | De Poortere et al. | | |
| 7,394,908 B2 * | 7/2008 | Katou et al. | .................... | 381/98 |
| 7,412,220 B2 * | 8/2008 | Beyer | ........................... | 455/222 |
| 7,476,797 B2 * | 1/2009 | Izumisawa et al. | ............ | 84/660 |
| 2001/0036278 A1 * | 11/2001 | Polisset et al. | .................. | 381/61 |
| 2004/0071297 A1 * | 4/2004 | Katou et al. | .................... | 381/61 |
| 2004/0234083 A1 * | 11/2004 | Katou et al. | .................. | 381/101 |
| 2007/0175318 A1 * | 8/2007 | Izumisawa et al. | ............. | 84/626 |
| 2008/0103763 A1 * | 5/2008 | Shimura et al. | ............ | 704/200.1 |
| 2008/0130915 A1 * | 6/2008 | Shimura et al. | ............... | 381/102 |
| 2008/0292114 A1 * | 11/2008 | Shimura et al. | ............... | 381/103 |

FOREIGN PATENT DOCUMENTS

| | | | |
|---|---|---|---|
| EP | 1915026 A2 * | 4/2008 | |
| JP | 04-137903 A | 5/1992 | |
| JP | 08-213862 | 8/1996 | |
| JP | 11-509712 T | 8/1999 | |
| JP | 2002-524993 T | 8/2002 | |
| JP | 2004-320516 A | 11/2004 | |
| JP | 2008103880 A * | 5/2008 | |

* cited by examiner

*Primary Examiner* — Laura Menz

(74) *Attorney, Agent, or Firm* — Wolf, Greenfield & Sacks, P.C.

(57) ABSTRACT

An audio signal processing apparatus includes a harmonic overtone adder and an equalizer. The harmonic overtone adder includes a high-pass filter for extracting from an audio signal higher than a first predetermined frequency, a filter for extracting a frequency component lower than half a second predetermined frequency, an harmonic overtone generator for generating a frequency-doubled harmonic overtone component from an output from the filter, and a first combining unit for combining the frequency component output from the high-pass filter and the harmonic overtone component output from the harmonic overtone generator. The equalizer includes a level detector for detecting a level of an overtone component contained in an output from the first combining unit, a gain controller for controlling dynamically the level of the harmonic overtone component contained in the output from the first combining unit, and a second combining unit for combining the output from the first combining unit with the harmonic overtone component.

8 Claims, 13 Drawing Sheets

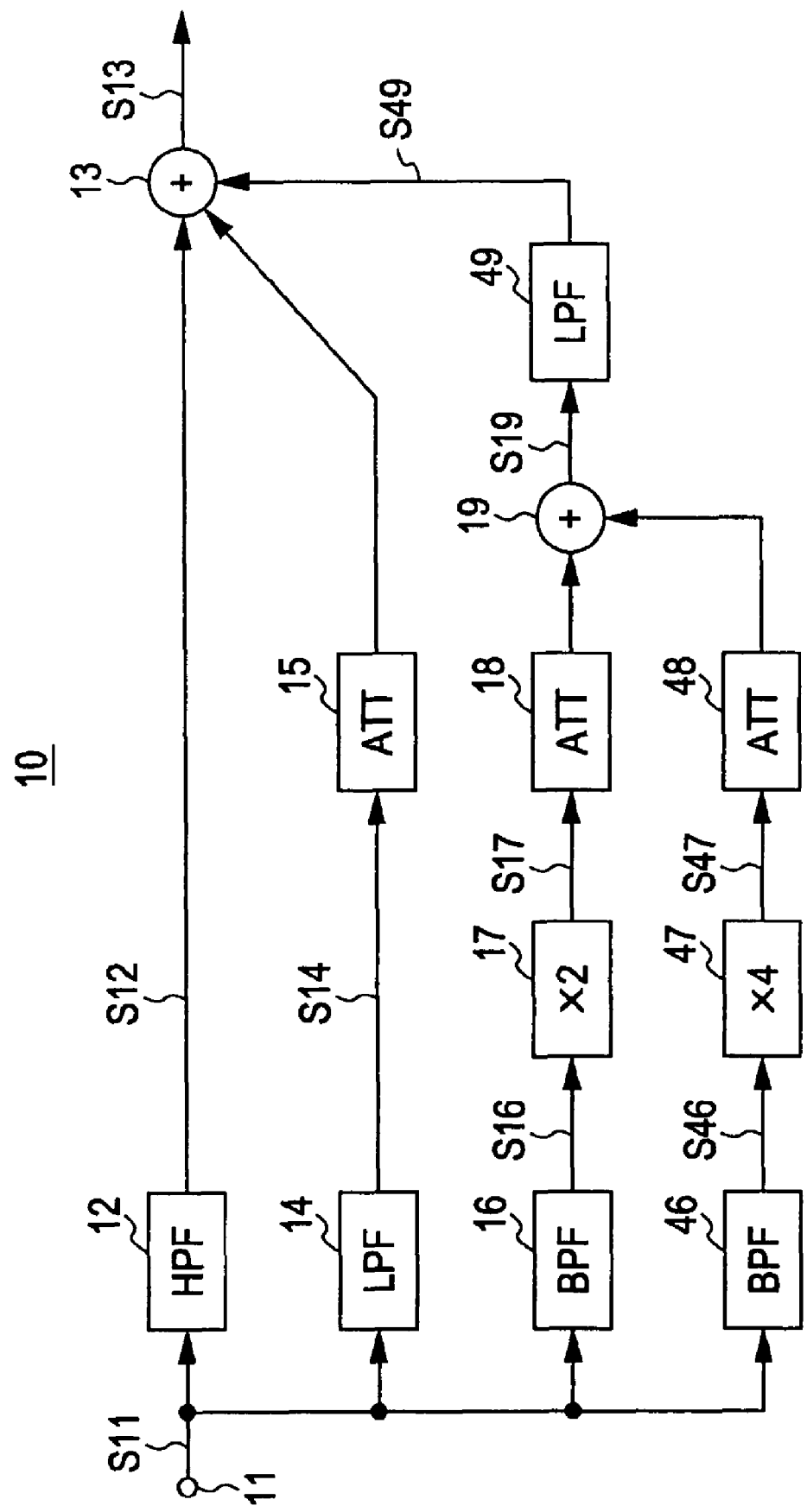

FIG. 12
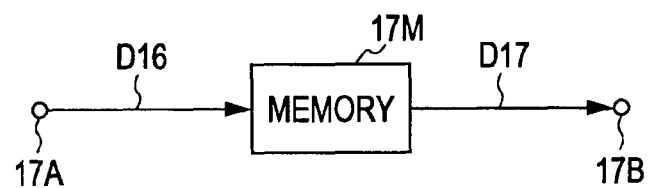
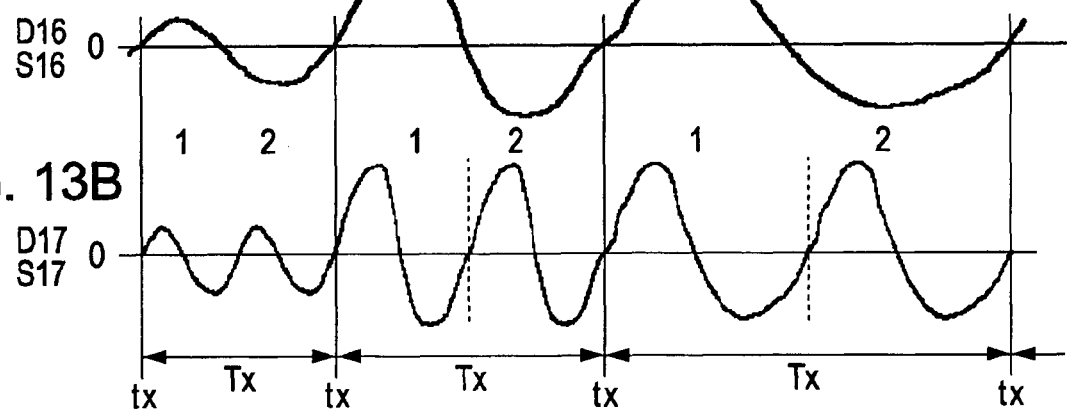

AUDIO REPRODUCING APPARATUS

CROSS REFERENCES TO RELATED APPLICATIONS

The present invention contains subject matter related to Japanese Patent Application JP 2006-283532 filed in the Japanese Patent Office on Oct. 18, 2006, the entire contents of which are incorporated herein by reference.

BACKGROUND OF THE INVENTION

1. Field of the Invention

The present invention relates to an audio reproducing apparatus.

2. Description of the Related Art

Small loudspeakers are employed in minicomponent stereo sets and flat-screen television receivers. In such applications, the enclosure of the loudspeaker (speaker box) is accordingly small. The resonance frequency f0 of the loudspeaker is as high as or higher than 100 Hz.

An audio signal having the resonance frequency f0 or lower may be supplied to the loudspeaker. With the frequency being lowered, the fundamental component is increasingly lowered while distorted components (harmonic components) sharply increases in the sound output pressure thereof.

Audio apparatuses having small loudspeakers cannot sufficiently reproduce low-frequency component lower than the resonance frequency f0 of the loudspeaker.

Two methods may be contemplated in the reproducing of the audio signal:

(1) an equalizer is used to boost the low-frequency component, and (2) a harmonic overtone component of the low-frequency component is output to achieve a low-frequency sound effect.

The method (1) provides the low-frequency sound effect by reinforcing the frequency component in the resonance frequency f0 band of the loudspeaker.

The method (2) takes advantage of the hearing of humans. More specifically, the sound of each musical instrument is composed of a fundamental component and harmonic components, and the ratio of the fundamental component to the harmonic components determines the tone of the sound. It has been psychoacoustically proved that if a sound without the fundamental component but with the harmonic components thereof is output humans hear as if the fundamental component is also output. The method (2) is based on such a human hearing property.

FIG. 14 illustrates an audio apparatus. A loudspeaker 5 is used to improve the low frequency sound effect. An audio signal S1 is supplied to a high-pass filter 2 at an input terminal 1. As shown in FIG. 15A, a middle to high-frequency component equal to or higher than the resonance frequency f0 of the loudspeaker 5 is extracted and supplied to an adder 3. The audio signal S1 at the terminal 1 is supplied to a band-pass filter 7. As shown in FIG. 15B, a low-frequency component S7 falling within a frequency band from f0/2 to f0 is extracted and supplied to a pitch shifter 8.

The pitch shifter 8 doubles the frequency of the supplied low-frequency component S7. As shown in FIG. 15C, a frequency multiplied component S8 within a band from f0 to 2f0, namely, the low-frequency component S8, is output.

The low-frequency component S8 is supplied to the adder 3 to be added to the middle to high-frequency component S2. The adder 3 outputs an audio signal S3 with the low-frequency component S8 as the low-frequency component S7 reinforced as shown in FIG. 15D. The audio signal S3 is output to the loudspeaker 5 via a power amplifier 4. The loudspeaker 5 thus emits an acoustic sound having frequency characteristics of FIG. 15D, namely, an acoustic sound with the low-frequency component S8 as the reinforced low-frequency component S7.

The sound of the low-frequency component S7 is not output from the loudspeaker 5 and corresponds to the fundamental component. The corresponding low-frequency component S8 is output from the loudspeaker 5. A listener hears as if the low-frequency component S7 is actually output. Even with the small loudspeaker 5, the low frequency sound effect is thus provided.

It is generally said that humans suffer from no unpleasant hearing impression on the low-frequency component S8 lower than 200 Hz even if the frequency multiplied component S5 is generated by multiplying the low-frequency component S7.

Japanese Unexamined Patent Application Publication No. 8-213862 discloses one such technique.

SUMMARY OF THE INVENTION

The method (1) of boosting the low-frequency component is not appropriate for the small loudspeaker that is originally unable to reproduce the low-frequency component. If an equalizer with a boost amount thereof fixed is used, signals are clipped, leading to noise and distortion. Supplying a deep bass component to the small loudspeaker is not preferable.

The method (2) of adding the harmonic overtone is effective with the small loudspeaker since the low-frequency component is not supplied to the loudspeaker 5. The low-frequency component S8 is similar to a harmonic component of the band-pass filter 7. If the low-frequency component S8 is increased in amount to achieve the low frequency sound effect, the degree of distortion is also increased. If the low-frequency component S8 is reduced in amount to lower the degree of distortion, the low frequency sound effect becomes insufficient. There is a trade-off between the low frequency sound effect and the degree of distortion.

It is thus desirable to overcome such a problem.

An audio signal processing apparatus includes a harmonic overtone adder and an equalizer. The harmonic overtone adder includes a high-pass filter for extracting from an audio signal a frequency component equal to or higher than a first predetermined frequency, a filter for extracting from the audio signal a frequency component equal to or lower than half a second predetermined frequency, an harmonic overtone generator for generating a frequency-doubled harmonic overtone component from an output from the filter, and a first combining unit for combining the frequency component output from the high-pass filter and the harmonic overtone component output from the harmonic overtone generator. The equalizer includes a level detector for detecting a level of an overtone component contained in an output from the first combining unit, a gain controller for controlling dynamically the level of the harmonic overtone component contained in the output from the first combining unit based on a detection output from the level detector, and a second combining unit for combining the output from the first combining unit with the harmonic overtone component output from the gain controller.

In accordance with embodiments of the present invention, if the low-frequency component of the audio signal is lower than the first predetermined frequency, the harmonic overtone of the low-frequency component is output. The harmonic overtone provides the low frequency sound effect. Since the level of the harmonic overtone is dynamically varied, a crisp low frequency sound effect is obtained while the degree of distortion in the output sound is reduced.

BRIEF DESCRIPTION OF THE DRAWINGS

FIG. 9 illustrates still another harmonic overtone adder in accordance with one embodiment of the present invention;

FIG. 12 illustrates a pitch shifter in the harmonic overtone adder;

FIGS. 13A and 13B are waveform diagrams of the patch shifter;

DESCRIPTION OF THE PREFERRED EMBODIMENTS

Figure 1:
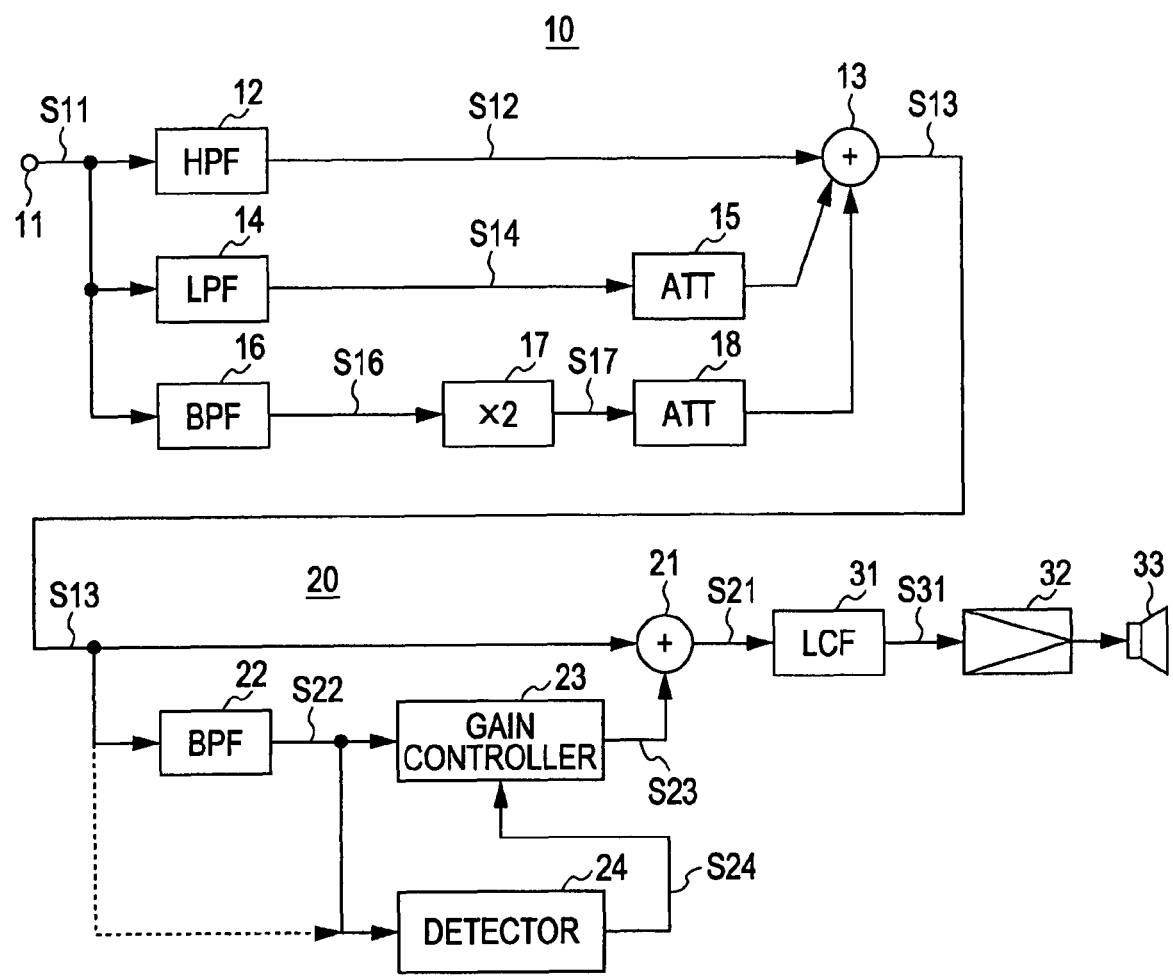
FIG. 1 is a block diagram of a harmonic overtone adder in accordance with one embodiment of the present invention.

FIG. 1 illustrates a harmonic overtone adder 10 in accordance with one embodiment of the present invention. A small loudspeaker 33 provides an improved low frequency sound effect. Let f0 represent a resonance frequency of the loudspeaker 33. The resonance frequency f0 is 100 Hz or lower. Let f1 represent a frequency upper limit below which a signal obtained by frequency multiplying a fundamental frequency signal causes no unpleasant hearing impression. The frequency upper limit f1 is a frequency obtained by frequency multiplying a fundamental frequency of a signal. The frequency upper limit f1 is about 200 Hz. Here, f0=f1/2 (or f0≦f1/2). In the case of a two-channel stereophonic system or multi-channel stereophonic system, each channel has the structure of FIG. 1.

An audio signal S11 to be reproduced is supplied to a harmonic overtone adder 10. A harmonic overtone component providing a low-frequency sound effect is thus added to the audio signal S11. The audio signal S1 is supplied to a high-pass filter 12 via an input terminal 11. As shown by a solid line in FIG. 2A, a low-frequency component S12 equal to or higher than the resonance frequency f0 of the loudspeaker 33, namely 100 Hz, in this case is extracted and then supplied to an adder 13. The audio signal S11 is supplied from the input terminal 11 to a low-pass filter 14. As shown by a broken line in FIG. 2A, a low-frequency component S14 equal to or lower than the resonance frequency f0 of the loudspeaker 33, namely 100 Hz, in this case is extracted by the low-pass filter 14. The low-frequency component S14 is then supplied to an attenuator 15. The attenuator 15 adjusted the low-frequency component S14 to a predetermined level and the resulting level adjusted component is supplied to the adder 13.

The audio signal S11 is supplied from the input terminal 11 to a band-pass filter 16. As shown by a solid line in FIG. 2B, a low-frequency component S16 falling within a frequency band f0/2 to f1/2, namely, 50 Hz to 100 Hz, is extracted. The low-frequency component S16 is then supplied to a pitch shifter 17.

One example of the pitch shifter 17 will be described later. The pitch shifter 17 doubles the frequency of the supplied low-frequency component S16. As shown by a broken line in FIG. 2B, a frequency doubled, harmonic overtone component S17 is extracted. Since the low-frequency component S16 falls within the frequency band f0/2-f1/2, the frequency band of the harmonic overtone component S17 becomes f0-f1. The frequency-doubled harmonic overtone component S17 is adjusted to a predetermined level by an attenuator 18 and the level-adjusted harmonic overtone component S17 is then supplied to the adder 13.

Figure 2A:
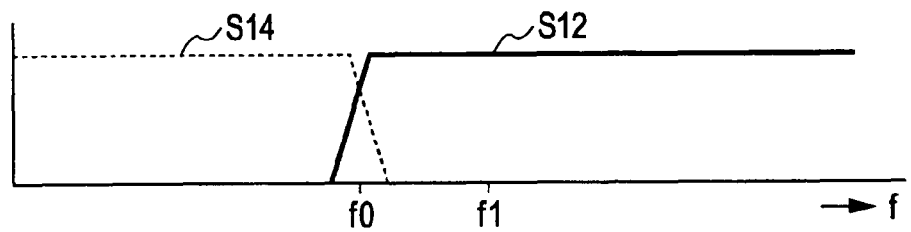
FIGS. 2A-2F illustrate frequency characteristics of the harmonic overtone adder in accordance with one embodiment of the present invention.
Figure 2B:
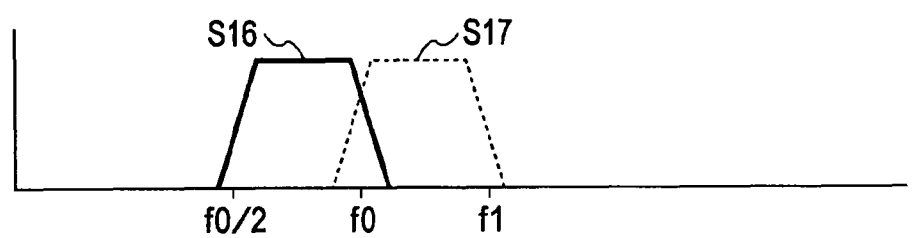
Figure 2C:
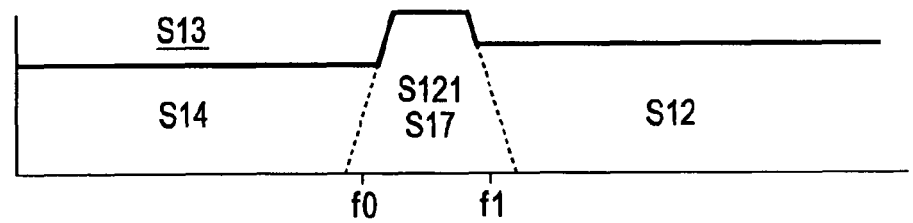

As shown in FIG. 2C, the adder 13 outputs an audio signal S13. The audio signal S13 is obtained by adding the low-frequency component S14 and the frequency-doubled harmonic overtone component S17 at predetermined ratios to the middle to high-frequency component S12.

Figure 2D:
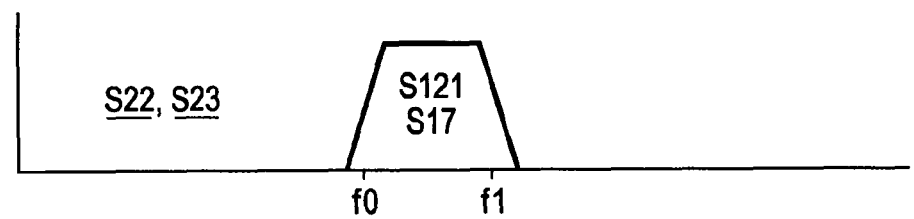

The audio signal S13 is supplied to a gain-controlling type equalizer 20. The equalizer 20 performs an equalization operation accounting for low frequency sound effect and distortion effect. The audio signal S13 is supplied to an adder 21 and a band-pass filter 22. As shown in FIG. 2D, a low-frequency component S22 falling within a frequency band f0-f1, namely, 100 Hz-200 Hz, is extracted. The low-frequency component S22 is supplied to the adder 21 via a gain controller 23 to be discussed later.

As shown in FIG. 2D, the low-frequency component S22 contains a low-frequency component S121 of the middle to high-frequency component S12 (FIG. 2A) and the harmonic overtone component S17. A signal component S23 as an output signal of the gain controller 23 is obtained by level controlling the low-frequency component S22, and contains the low-frequency component S121 and the pitch shifter 17.

The low-frequency component S22 is supplied from the band-pass filter 22 to a level detector 24. As represented by a solid wave line in FIG. 3, one cycle of the low-frequency component S22, i.e., a duration Tx from a reversal from negative to positive to a next reversal from negative to positive is determined as one period. A peak level V22 (absolute value), detected within one period Tx, is referred to as a detected signal S24 (absolute value). The detected signal S24 is supplied to the gain controller 23 as a gain control signal.

Figure 4:
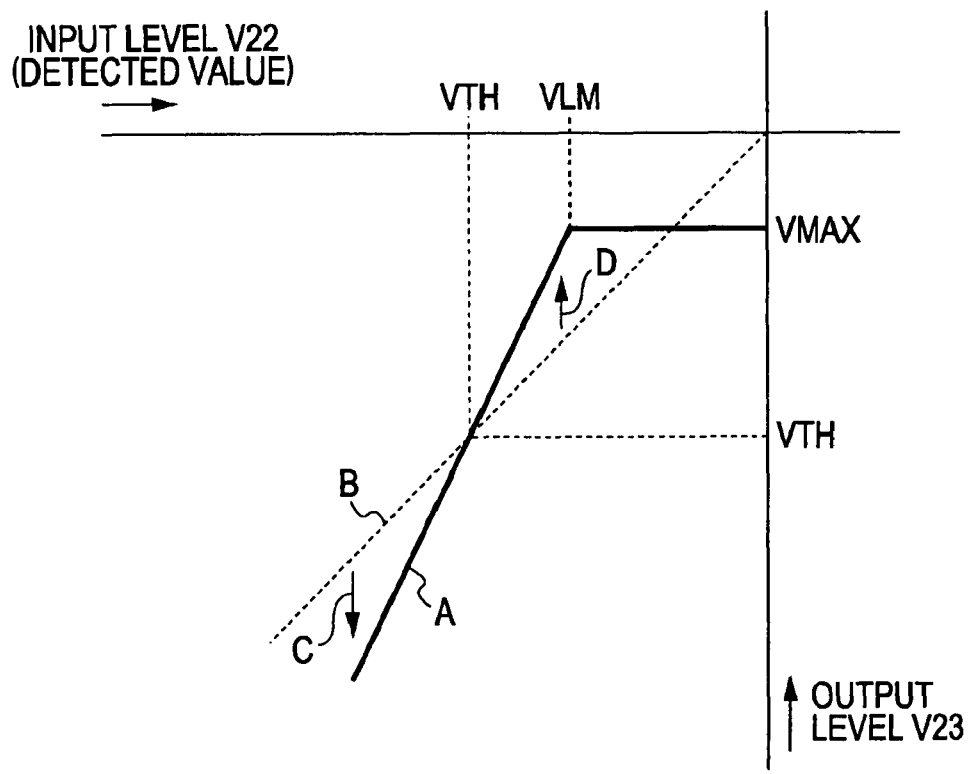
FIG. 4 is a control characteristic chart of the harmonic overtone adder.

FIG. 4 illustrates control characteristics of the gain controller 23. The abscissa represents the input level of the low-frequency component S22 supplied to the gain controller 23, namely, the peak level V22 of the band-pass filter 22 within one period Tx from which the signal S24 is detected. The ordinate represents an output level V23 of a low-frequency component S23 output from the gain controller 23. A broken line B represents characteristics with gain being 1 regardless of the input level V22 (peak level) for reference only in FIG. 4.

Control characteristics of the gain controller 23 is represented by line A. Let VLM represent a predetermined upper limit and VTH represent a predetermined threshold level (VLM>VTH). V23=VMAX holds if V22≧VLM. V23 is in linear proportion to level V22 with relationship V22<VLM held. Gain is greater than 1 if relationship VTH<V22<VLM holds. Gain is 1 if relationship V22=VTH holds. Gain is smaller than 1 if relationship V22<VTH holds.

The gain controller 23 level controls the low-frequency component S22 on a per period Tx in accordance with the detected signal S24 and the control characteristics A. The peak level V22 cannot be known until one period Tx is completed. For simplicity, it is assumed the peak level V22 within the one period Tx can be detected at the start of the period Tx. For detection and control, the low-frequency component S22 to be level controlled is pre-delayed to be synchronized with the corresponding detected signal S24.

Figure 2E:
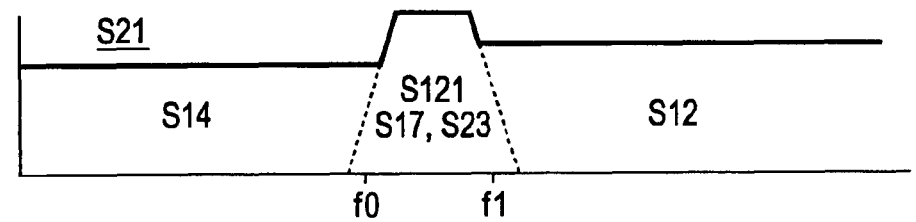
Figure 2F:
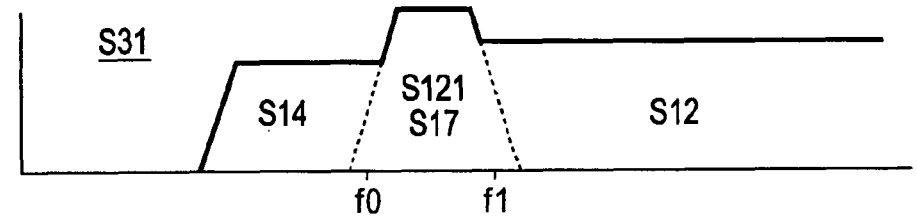

The adder 21 adds the low-frequency component S23 level controlled by the gain controller 23 to the audio signal S13 from the adder 13. As shown in FIG. 2E, the adder 13 outputs an audio signal S21 composed of the frequency components S14, S121, S17 and S12. The audio signal S21 is then supplied to a low-frequency cutoff filter 31. As shown in FIG. 2F, the low-frequency cutoff filter 31 removes a deep bass component detrimental to the small loudspeaker 33, i.e., the low-frequency cutoff filter 31 outputs an audio signal S31. Although almost no standard low frequency sound is output from the loudspeaker 33, a low-frequency component becoming a distorted component (harmonic component) could be output. The low-frequency cutoff filter 31 removes such a low-frequency component. The low-frequency cutoff filter 31 is then supplied to the loudspeaker 33 via a power amplifier 32.

With the above-described arrangement, the audio signal S31 of FIG. 2F is output with the audio signal S11 input to the input terminal 11. The audio signal S31 is then supplied to the loudspeaker 33, and the resulting sound is output from the loudspeaker 33. As shown in FIG. 2F, the audio signal S31 supplied to the loudspeaker 33 contains the harmonic overtone component S17 twice as high in frequency as the low-frequency component S16 (FIG. 2B).

Although almost no sound of the fundamental component lower than the resonance frequency f0 is output from the loudspeaker 33, the harmonic overtone component S17 twice as high as the low-frequency component S16 is output. A listener may hear the sound as if the sound lower than the resonance frequency f0 is output. Even with the small loudspeaker 33, the low frequency sound effect is provided.

The gain controller 23 level controls the low-frequency component S22 containing the harmonic overtone component S17 to the low-frequency component S23. Since the low-frequency component S23 has control characteristics as shown in FIG. 4, the output low-frequency component S23 has the waveform (level) as represented by a broken line in FIG. 3. If the peak level V22 of the low-frequency component S22 within the one period Tx is lower than the threshold level VTH, the output level V23 of the low-frequency component S23 becomes smaller than the original magnitude as represented by an arrow C in FIG. 4. If the peak level V22 of the low-frequency component S22 within the one period Tx is higher than the threshold level VTH, the output level V23 of the low-frequency component S23 becomes larger than the original magnitude as represented by an arrow D in FIG. 4.

Figure 3:
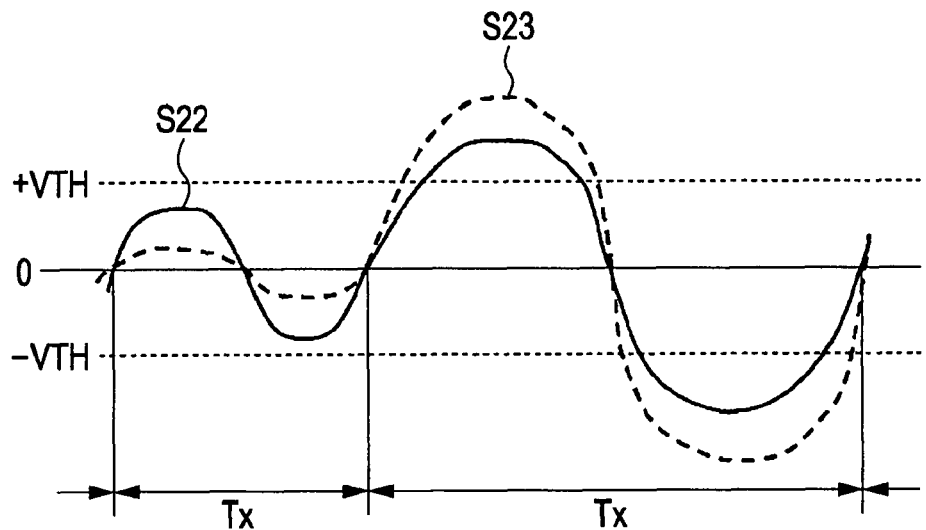
FIG. 3 is a waveform diagram of the harmonic overtone adder.

As represented by the broken line in FIG. 3, the output level V23 of the low-frequency component S23 output from the gain controller 23 becomes more smaller throughout one period Tx during which the peak level V22 is smaller than the threshold level VTH, and becomes more larger throughout one period Tx during which the peak level V22 is larger than the threshold level VTH. Since the harmonic component S17 contained in the low-frequency component S23 dynamically changes in level in the same way, a crisp low frequency sound effect is reached while distortion effect is restricted.

Since part of the low-frequency component S14 contained in the audio signal S11 still remains as shown in FIGS. 2A and 2F, the low frequency sound effect becomes natural. A deep bass component detrimental to the small loudspeaker 33, out of the low-frequency component S14, is removed by the low-frequency cutoff filter 31, and outputting a large amount of distorted component (harmonic component) is avoided.

In the above discussion, the low-frequency component S22 output from the band-pass filter 22 is supplied to the detector 24. As represented by a broken line in FIG. 1, the audio signal S13 output from the adder 13 may be supplied to the detector 24 to obtain the detected signal S24.

Figure 5:
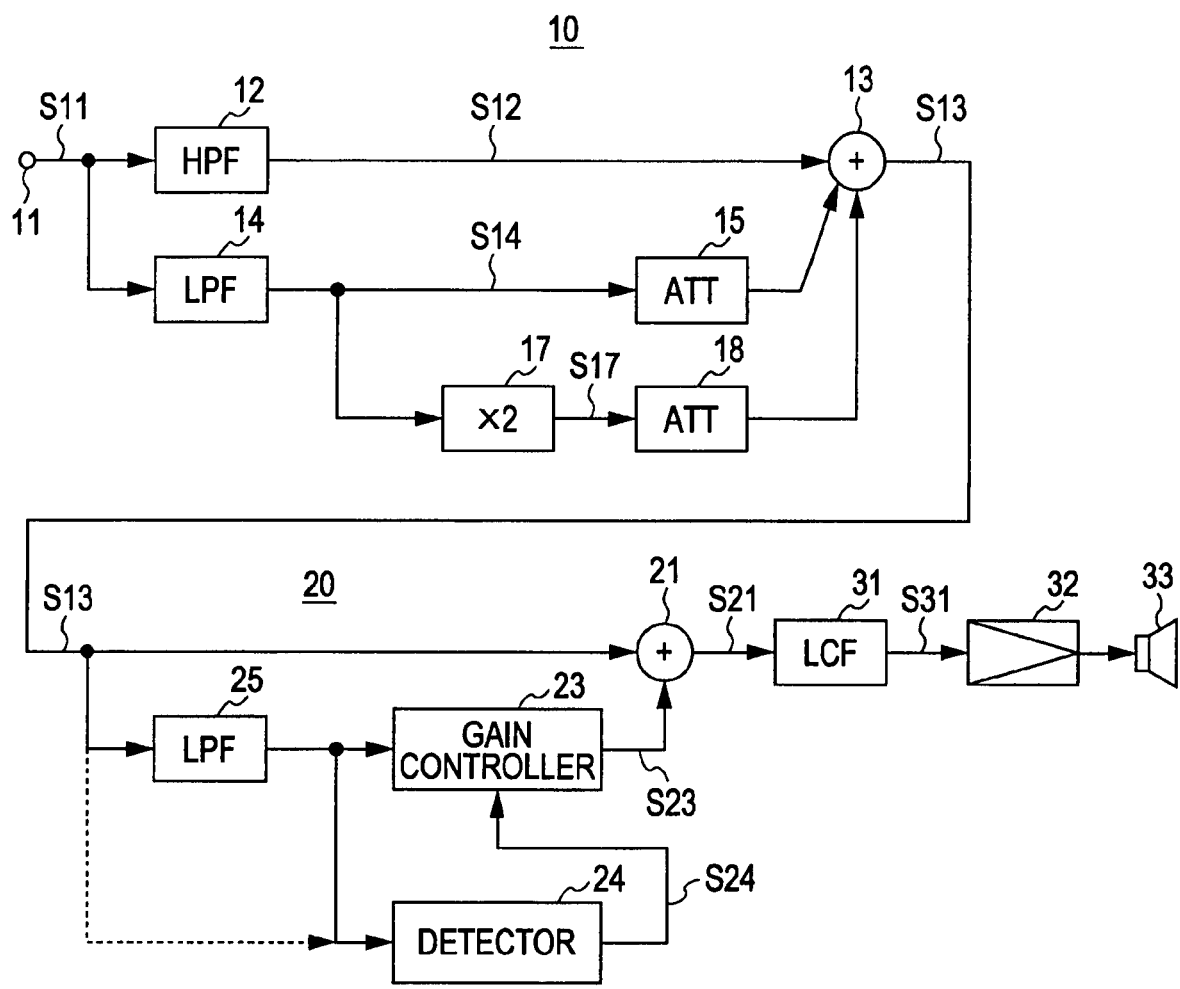
FIG. 5 is a block diagram of another harmonic overtone adder in accordance with one embodiment of the present invention.

FIG. 5 illustrates a harmonic overtone adder 10 in accordance with a second embodiment of the present invention. In the harmonic overtone adder 10, the band-pass filter 16 is removed, and the low-frequency component S14 output from the low-pass filter 14 is supplied to the pitch shifter 17. The band-pass filter 22 is replaced with a low-pass filter 25 having the upper limit frequency f1 as a cutoff frequency. The rest of the harmonic overtone adder of FIG. 5 is identical to the harmonic overtone adder of FIG. 1.

The harmonic overtone component S17 of the low-frequency component S14 is output as a sound. The listener thus hears the sound as if the sound below the resonance frequency f0 is also output. Even the small loudspeaker 33 provides the low frequency sound effect.

The gain controller 23, having the control characteristics of FIG. 4, level controls the low-frequency component S22 containing the harmonic overtone component S17 to the low-frequency component S23. The harmonic overtone component S17 contained in the low frequency component S23 output from the gain controller 23 dynamically changes the level thereof. A crisp low frequency sound effect results while distortion effect is controlled.

As represented by a broken line in FIG. 5, the audio signal S13 output from the adder 13 is supplied to the detector 24, and the detector 24 outputs the detected signal S24.

Figure 6:
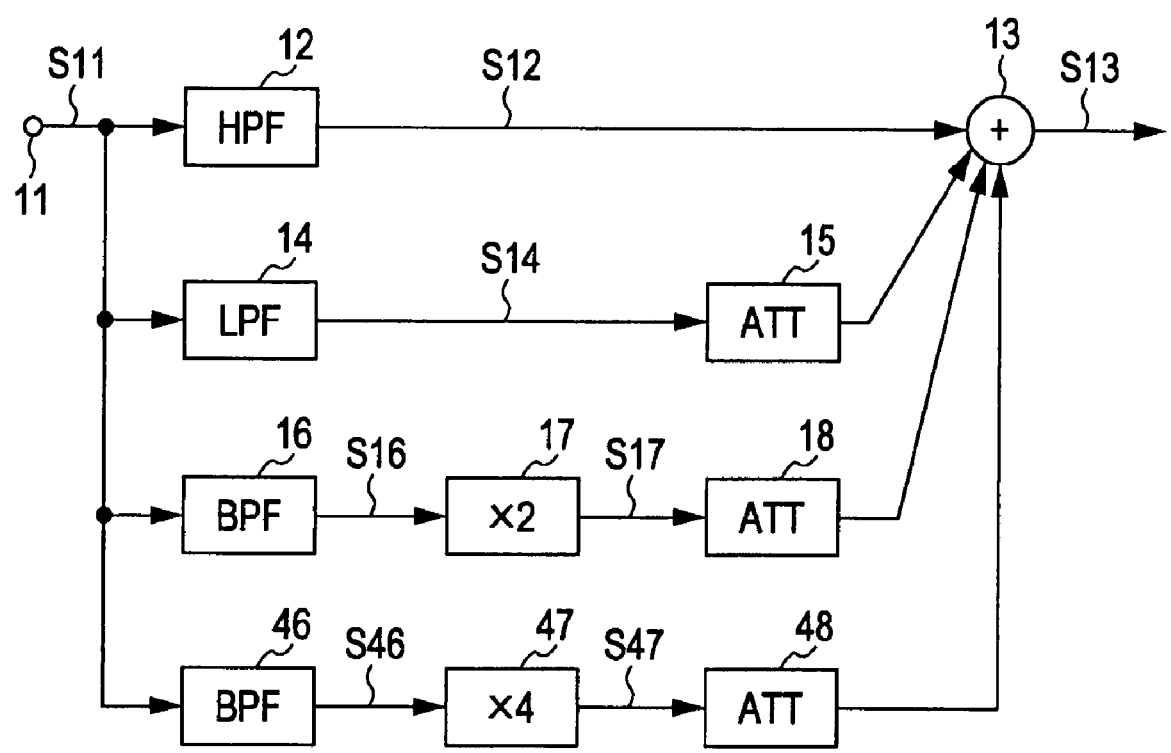
FIG. 6 is a block diagram illustrating yet another harmonic overtone adder in accordance with one embodiment of the present invention.
Figure 7A:
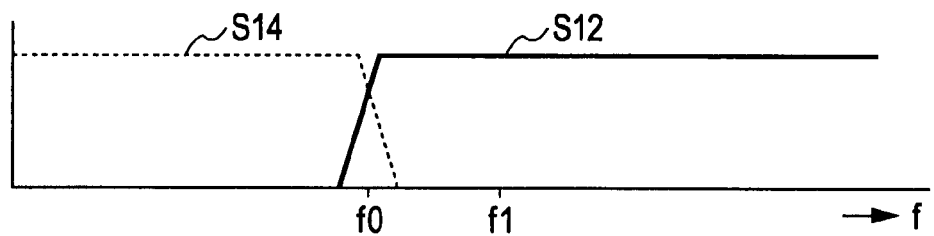
FIGS. 7A-7C illustrates frequency characteristics of the harmonic overtone adder of FIG. 6.

FIG. 6 illustrates a first modification of the harmonic overtone adder 10. As shown in FIG. 6, part of the harmonic overtone adder 10 is identical to the harmonic overtone adder 10 of FIG. 1. As shown in FIG. 7A, a high-pass filter 12 and the low-pass filter 14 respectively extract the middle to high frequency component S12 and the low-frequency component S14 from the audio signal S11, and then supply these components to the adder 13.

Figure 7B:
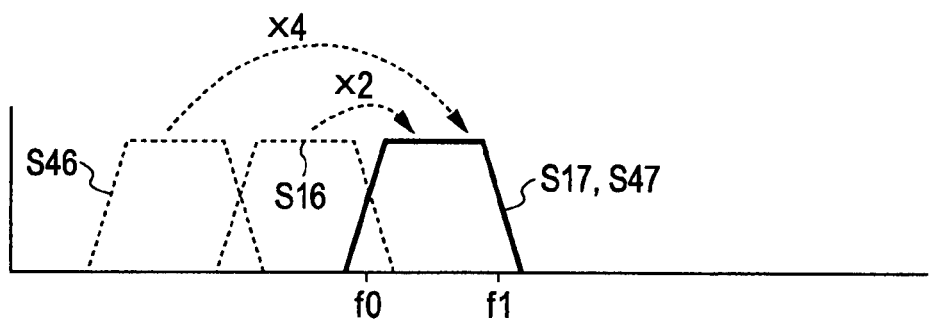

As shown in FIG. 7B, the band-pass filter 16 extracts the low-frequency component S16 falling within a range of f0/2 to f1/2, and the pitch shifter 17 doubles the frequency of the low-frequency component S16 to the harmonic overtone component S17. The harmonic overtone component S17 is supplied to the adder 13 via the attenuator 18.

The audio signal S11 is supplied to a band-pass filter 46 via the input terminal 11. As shown in FIG. 7B, a low-frequency component S46 falling within a frequency range f0/4-f1/4 is thus extracted. The low-frequency component S46 is frequency multiplied by a pitch shifter 47 into a quadrupled frequency, harmonic overtone component S47. The harmonic overtone component S47 is supplied to the adder 13 via an attenuator 48.

Figure 7C:
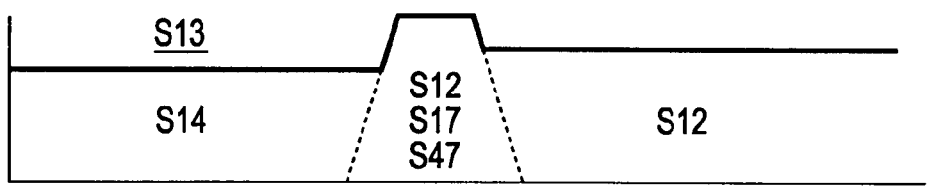

As shown in FIG. 7C, the adder 13 adds to the middle to high-frequency component S12, the low-frequency component S14, the frequency-doubled, harmonic overtone component S17 and the frequency-quadrupled, harmonic overtone component S47 at predetermined ratios through the attenuators 15, 18 and 48, thereby outputting the resulting audio signal S13.

The subsequent process is identical to the process discussed with reference to FIG. 1. The audio signal S13 is supplied to the loudspeaker 33 via the equalizer 20, the low-frequency cutoff filter 31 and the power amplifier 32, though the discussion thereof is omitted herein.

With this arrangement, the loudspeaker 33 emits almost no sound of the fundamental component below the resonance frequency f0, but emits the sound of the harmonic overtone component S17 and the harmonic overtone component S47. The listener thus hears the sound as if the sound lower than the resonance frequency f0 is output. Even with the small loudspeaker 33, the low frequency sound effect is achieved.

Figure 8A:
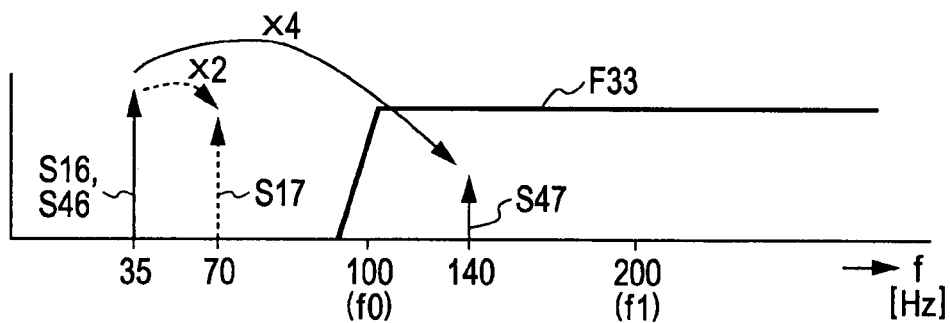
FIGS. 8A and 8B illustrate frequency characteristics of the harmonic overtone adder of FIG. 6.

If the low-frequency component S16 (S46) is 35 Hz as shown in FIG. 8A, the harmonic overtone component S17 (represented by an arrow-headed broken line) obtained by doubling the frequency of the low-frequency component S16 has a frequency of 70 Hz, and the loudspeaker 33 is still unable to reproduce the harmonic overtone component S17 as represented by frequency characteristics F33 of the loudspeaker 33.

In the harmonic overtone adder 10 of FIG. 6, the low-frequency component S16 having a frequency of 35 Hz, namely, the low-frequency component S46 is supplied to the pitch shifter 47 via the band-pass filter 46. The pitch shifter 47 frequency quadruples the low-frequency component S16 to the frequency-quadrupled, harmonic overtone component S47 (arrow-headed solid line) having a frequency of 140 Hz. The harmonic overtone component S47 is supplied to the adder 13. With the low-frequency component S16 having a frequency of 35 Hz, the frequency quadrupled, harmonic overtone component S47 results in a low frequency sound corresponding to the harmonic overtone component S17.

Figure 8B:
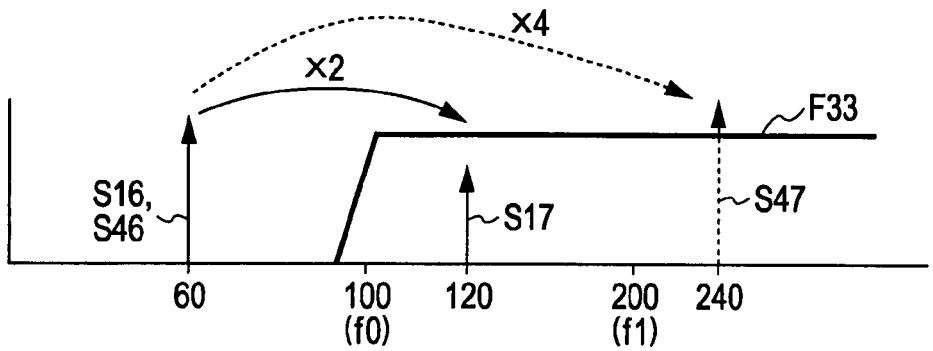

As shown in FIG. 8B, the low-frequency component S46 (S16) might have a frequency of 60 Hz. If the low-frequency component S46 is quadrupled in frequency to the harmonic overtone component S47 (as represented by an arrow-headed broken line), the resulting frequency is 240 Hz. The resulting frequency of 240 Hz is above the frequency upper limit f1 (≈200 Hz) in the addition of the harmonic overtone. If the resulting harmonic overtone component S47 is supplied to the loudspeaker 33, an output sound results in an unpleasant hearing impression in human ears.

The low-frequency component S46 might have a frequency of 60 Hz in the harmonic overtone adder 10 of FIG. 6. The band-pass filter 46, namely, the low-frequency component S16 is supplied to the pitch shifter 17 via the band-pass filter 16. The pitch shifter 17 frequency doubles the low-frequency component S16 to the frequency-doubled, harmonic overtone component S17 (represented by an arrow-headed solid line) having a frequency of 120H. The resulting harmonic overtone component S17 is supplied to the adder 13. Even when the low-frequency component S46 has a frequency of 60 Hz, the frequency-doubled, harmonic overtone component S17 results in a low frequency sound corresponding to the low-frequency component S46.

Figure 10A:
FIGS. 10A and 10B illustrate frequency characteristics of the harmonic overtone adder of FIG. 9.

FIG. 9 illustrates a second modification of the harmonic overtone adder 10. As the harmonic overtone adder 10 of FIG. 6, the harmonic overtone adder 10 of FIG. 9 adds the frequency-quadrupled, harmonic overtone component S47 if the fundamental frequency component is low. The harmonic overtone components S17 and S47 respectively output from the pitch shifters 17 and 47 are supplied to an adder 19 via the attenuators 18 and 48. As shown in FIG. 10A, a harmonic overtone component S19 containing the harmonic overtone components S17 and S47 is extracted and then supplied to a low-pass filter 49.

Figure 10B:
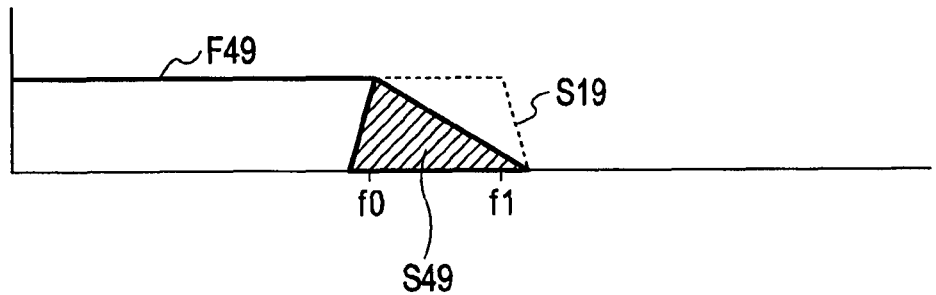

The low-pass filter 49 has frequency characteristics F49 of FIG. 10B. The low-pass filter 49 has the frequency upper limit f1 as the cutoff frequency thereof at which the input signal is almost cut off.

The low-pass filter 49 outputs, out of the low-frequency component S19, a frequency-doubled and frequency-quadrupled harmonic overtone component S49 (hatched area) which causes no unpleasant hearing impression. The harmonic overtone component S49 is supplied to the adder 13.

The rest of the harmonic overtone adder of FIG. 5 is identical to the harmonic overtone adder of FIG. 1. The audio signal S13 is supplied to the loudspeaker 33 via the equalizer 20, the low-frequency cutoff filter 31 and the power amplifier 32, though such path is not shown.

As the harmonic overtone adder 10 of FIG. 6, the pitch shifters 17 and 47 output the frequency-doubled harmonic overtone component S17 and the frequency-quadrupled harmonic overtone component S47 by doubling the frequency of the low-frequency component S16 and by quadrupling the frequency of the low-frequency component S46, respectively. The listener may hear the sound as if the sound lower than the resonance frequency f0 is emitted. Even with the small loudspeaker 33, the low frequency sound effect is achieved.

The low-pass filter 49 lowers more the level of the low-frequency component S19 output from an adder 19 as frequency becomes closer to the frequency upper limit f1. Even if the low-frequency component S19 contains a frequency component close to or even above the frequency upper limit f1, an unpleasant hearing impression is controlled. A low frequency sound effect is thus provided even within the frequency range f0>f1/2 without any unpleasant hearing impression.

Figure 11A:
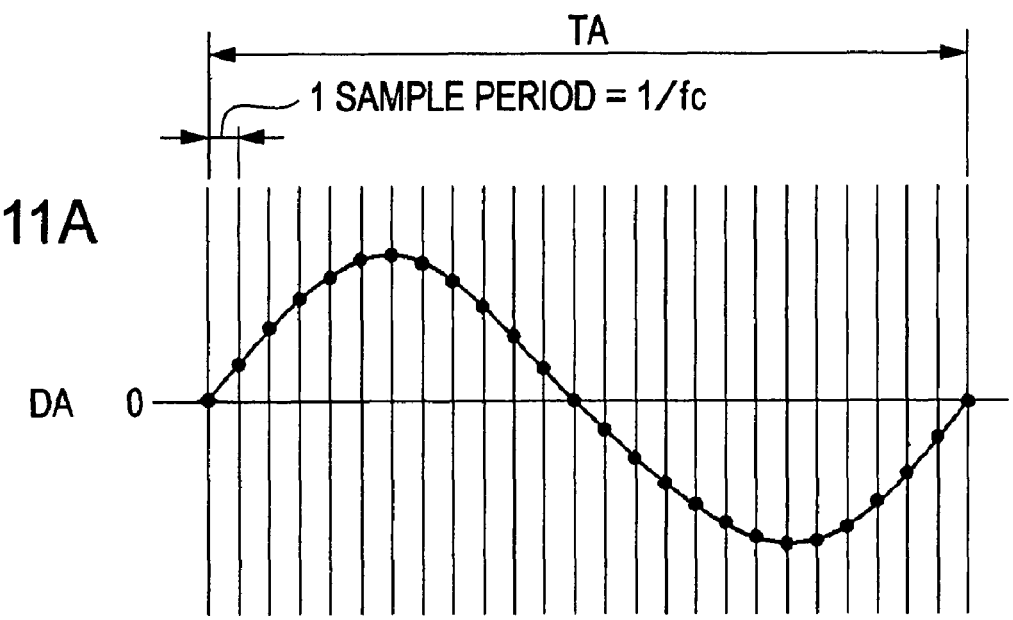
FIGS. 11A-11C are waveform diagrams of the harmonic overtone adder.
Figure 11B:
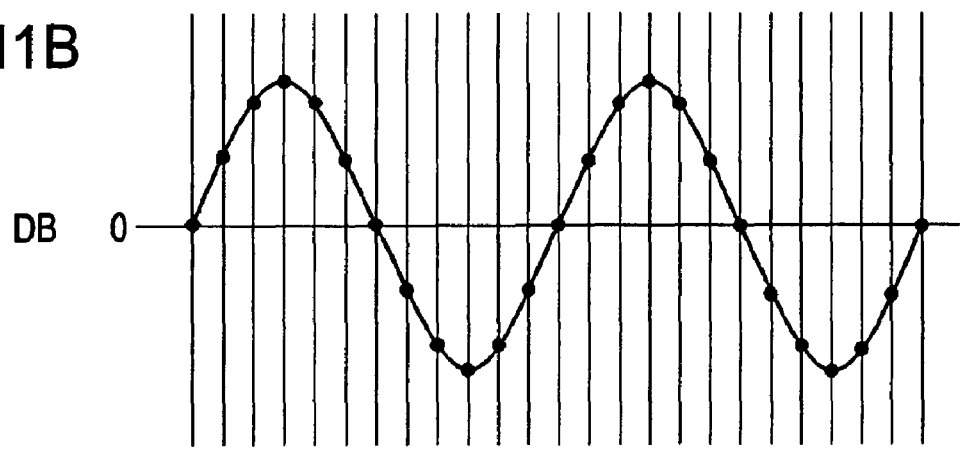
Figure 11C:
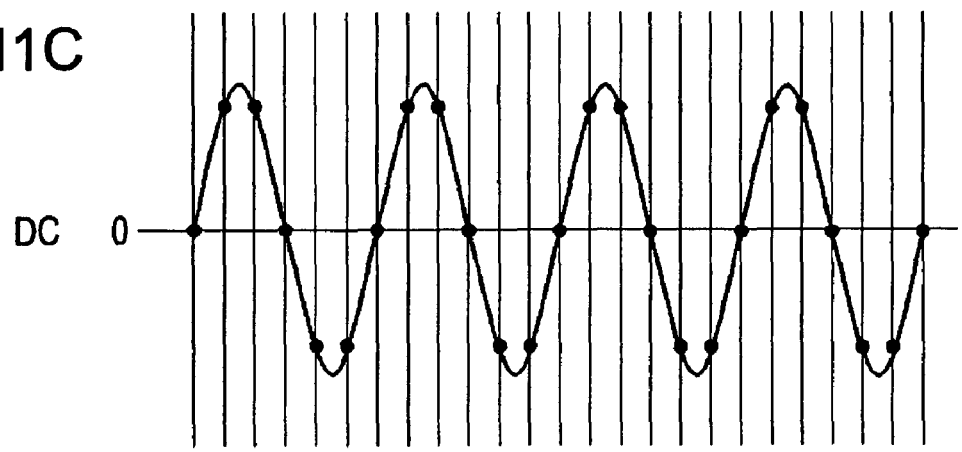
Figure 14:
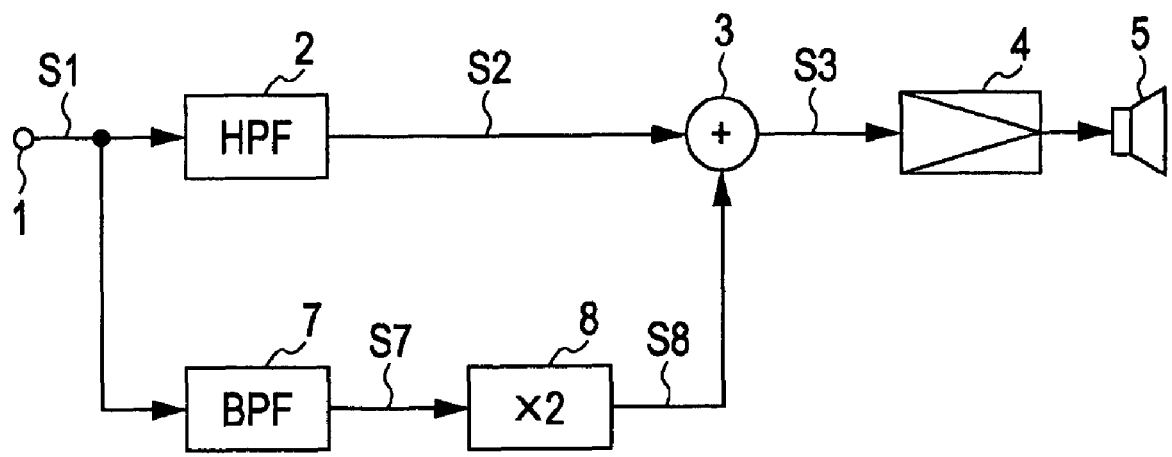
FIG. 14 illustrates a harmonic overtone adder as a known art.
Figure 15A:
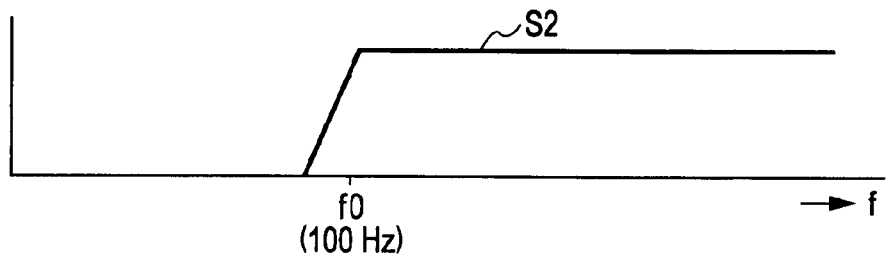
FIGS. 15A-15D illustrate frequency characteristics of the known harmonic overtone adder.
Figure 15B:
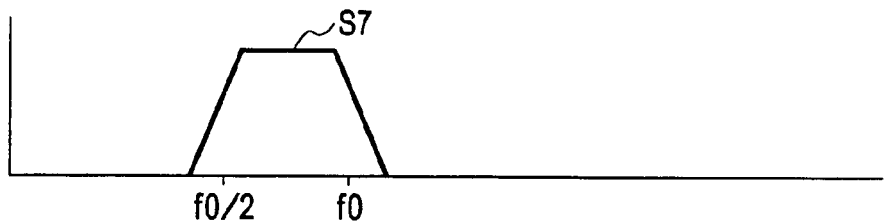
Figure 15C:
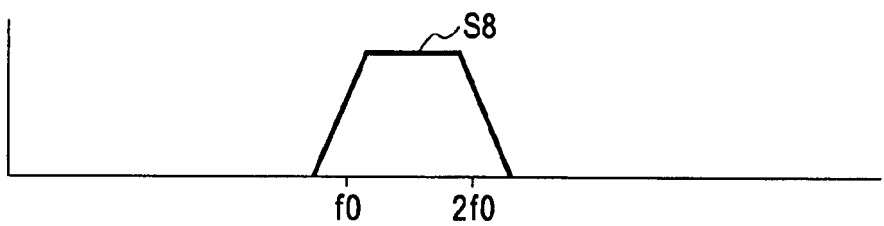
Figure 15D:
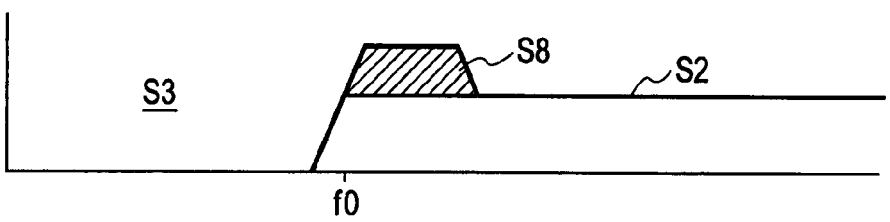

The harmonic overtone component S17 twice in frequency the low-frequency component S16 and the pitch shifter 47 four times in frequency the low-frequency component S46 are produced as shown in FIGS. 11A-11C. As shown in FIG. 11A, digital data DA for digital-to-analog converting one period of a sinusoidal signal SA is now stored on a memory. Each solid dot symbol "●" represents a sampling point, and one sample is stored at one corresponding address. A duration TA represents one sample cycle of the sinusoidal signal SA, and a duration 1/fc is one sample period.

If the digital data DA is read at a clock frequency fc identical to a write clock, one cycle of the sinusoidal signal SA can be read for the duration TA.

The digital data DA may be read from one at every two addresses at the clock frequency fc identical to the write clock, and the reading operation is repeated twice as shown in FIG. 11B. A sinusoidal signal SB of two cycles twice in frequency the sinusoidal signal SA is obtained for the duration TA. More specifically, during the duration TA, the harmonic overtone component SB twice in frequency the sinusoidal signal SA is obtained.

The digital data DA may be read from one at every four addresses at the clock frequency fc identical to the write clock, and the reading operation is repeated four times as shown in FIG. 11C. A sinusoidal signal SC of four cycles four times in frequency the sinusoidal signal SA is obtained for the duration TA. More specifically, during the duration TA, the harmonic overtone component SC four times in frequency the sinusoidal signal SA is obtained.

The pitch shifters 17 and 47 have a structure as shown in FIG. 12. FIG. 12 illustrates a memory 17M having large number of addresses (large capacity) composed of a ring buffer. The low frequency component S16 may have a waveform of FIG. 13A, digital data D16 may be obtained by analog-to-digital converting the waveform, and fc may represent a sampling frequency (clock frequency).

Let tx represent the timing at which the polarity of the digital data D16 (low-frequency component S16) is reversed from negative to positive, and Tx represent a duration from one tx to the next tx, namely, one period of the low-frequency component S16.

As shown in FIG. 12, the digital data D16 is supplied to the memory 17M via an input terminal 17A. As shown in FIG. 13A, the digital data D16 is written on the addresses of the memory 17M every one sample. The duration Tx of FIGS. 13A and 13B correspond to the duration TA of FIG. 11A. FIG. 13A corresponds to FIG. 11A.

At the same time as the digital data D16 is written on the memory 17M, the digital data D16 is read from the memory 17M. For simplicity of explanation, the duration Tx for the write operation equals the duration Tx for the read operation in FIGS. 13A and 13B.

The read operation from the pitch shifter 17 is performed in the same manner as described with reference to FIG. 11B. More specifically, the digital data D16 is read from one at every two addresses at the clock frequency fc equal to the one for the write operation. During the duration Tx, the read operation is repeated twice. Read digital data D17 is digital-to-analog converted, and the harmonic overtone component S17 twice in frequency the original low-frequency component S16 is obtained.

Similarly, the low-frequency component S46 is analog-to-digital converted and written on the memory 17M. The written data is then read as shown in FIG. 11C. The digital data D16 is read from one at every four addresses at the clock frequency fc equal to the one for the write operation. During the duration Tx, the read operation is repeated four times. Read digital data is digital-to-analog converted, and the harmonic overtone component S47 four times in frequency the original low-frequency component S46 is obtained.

Even when the low-frequency component S16 is lower in frequency than the resonance frequency f0 of the loudspeaker 33, the pitch shifter 17 converts the low-frequency component S16 into the harmonic overtone component S17 higher in frequency than the resonance frequency f0 of the loudspeaker 33. The harmonic overtone component S17 is added to the middle to high-frequency component S12 and the resulting component is supplied to the loudspeaker 33. Even the small loudspeaker 33 can provide a low frequency sound effect.

Since the harmonic overtone component S17 contained in the low-frequency component S23 dynamically changes in level as shown in FIG. 3, a crisp low frequency sound effect is provided while distortion effect is restricted.

The low-frequency component S16 is frequency-doubled or frequency-quadrupled so that the resulting harmonic overtone components fall within the frequency range from the resonance frequency f0 to the frequency upper limit f1. As a result, no unpleasant hearing impression is caused.

For example, since a harmonic overtone component with the frequency thereof three times the fundamental component has no octaval relationship with the fundamental component, an unpleasant hearing impression is given to the listener. The harmonic overtone components twice or four times in frequency the fundamental frequency have one octave or two octaves higher than the fundamental frequency and cause no unpleasant hearing impression to the listener.

In the above embodiments, the level detector 24 detects the peak level V22 within the one period Tx, and controls gain within the one period Tx. Alternatively, a mean level may be detected within the one period Tx, and gain is controlled within the one period Tx. Alternatively, the level of the harmonic overtone component supplied to the detector 24 is detected for each sample, in other words, the envelope of the harmonic overtone component is detected and used to control gain. Alternatively, gain may be controlled taking into consideration the characteristics of the loudspeaker 33 such as attack time and release time.

The control characteristics of the gain controller 23 of FIG. 4 may be inverted. More specifically, gain is set to be smaller than 1 with relationship V22>VTH held, and gain is set to be 1 with relationship V22=VTH held. Gain may be set to be larger than 1 with relationship V22<VTH held. In such a case, automatic gain control (AGC) also works and the low frequency sound effect is thus provided.

The process of obtaining intermediate signals and the resulting audio signal S31 from the audio signal S11 may be a digital process performed by a digital signal processor or other dedicated hardware. In such a case, the buffer memory may be shared with the digital signal process, for example.

In the above discussion, the pitch shifters 17 and 47 frequency multiplies the input digital data D16 (S16) every period of the digital data D16. Alternatively, the digital data D16 may be doubled in frequency every predetermined duration of time. In such a case, an end point of one period and a start point of the next period may be concatenated in a smooth fashion.

The low-frequency cutoff filter 31 may be arranged between the harmonic overtone adder 10 and the equalizer 20. The resonance frequency f0 is the resonance frequency of the loudspeaker 33. In actual products, however, another frequency may be set as the frequency f0 taking into consideration a frequency at which a low frequency sound effect is desired.

It should be understood by those skilled in the art that various modifications, combinations, sub-combinations and alterations may occur depending on design requirements and other factors insofar as they are within the scope of the appended claims or the equivalents thereof.

What is claimed is:

1. An audio signal processing apparatus comprising:
a harmonic overtone adder and an equalizer,
the harmonic overtone adder including:
a high-pass filter for extracting from an audio signal a first frequency component equal to or higher than a first predetermined frequency;
a filter for extracting from the audio signal a second frequency component equal to or lower than half a second predetermined frequency;
an harmonic overtone generator for generating a frequency-doubled harmonic overtone component from an output from the filter; and
a first combining unit for combining the first frequency component extracted by the high-pass filter and the frequency-doubled harmonic overtone component generated by the harmonic overtone generator; and
the equalizer including:
a level detector for detecting a level of the frequency-doubled harmonic overtone component contained in an output from the first combining unit;
a gain controller for controlling dynamically the level of the frequency-doubled harmonic overtone component contained in the output from the first combining unit based on a detection output from the level detector; and a second combining unit for combining the output from the first combining unit with the frequency-doubled harmonic overtone component output from the gain controller.

2. The audio signal processing apparatus according to claim 1, wherein the first predetermined frequency is a resonance frequency of a loudspeaker, and wherein the second predetermined frequency is an upper frequency limit below which a signal obtained by frequency multiplying a fundamental frequency signal causes no unpleasant hearing impression.

3. The audio signal processing apparatus according to claim 1, wherein the harmonic overtone adder comprises a frequency-quadrupled harmonic overtone generator for generating a frequency-quadrupled harmonic overtone component by frequency quadrupling the output of the filter, and wherein the frequency-quadrupled harmonic overtone component generated by the frequency-quadrupled harmonic overtone generator is supplied to the first combining unit to be combined with the first frequency component extracted by the high-pass filter.

4. The audio signal processing apparatus according to claim 1, further comprising a low frequency cutoff filter for removing from an output from the second combining unit a low-frequency component lower than the first predetermined frequency.

5. The audio signal processing apparatus according to claim 1, wherein the level detector determines one cycle in response to a duration within which a polarity of a low-frequency component contained in the output of the first combining unit is reversed, and detects the level of the frequency-doubled harmonic overtone component within the one cycle.

6. The audio signal processing apparatus according to claim 5, wherein the one cycle is a period from a reversal of the polarity of the level of the low-frequency component from negative to positive to a next reversal of the polarity of the level from negative to positive.

7. The audio signal processing apparatus according to claim 5, wherein the level detector detects a peak level in the one cycle.

8. The audio signal processing apparatus according to claim 4, wherein the level detector detects a mean level throughout the one cycle.

* * * * *